(12) United States Patent
Park et al.

(10) Patent No.: US 10,373,972 B2
(45) Date of Patent: Aug. 6, 2019

(54) VERTICAL MEMORY DEVICES AND METHODS OF MANUFACTURING VERTICAL MEMORY DEVICES

(71) Applicant: SAMSUNG ELECTRONICS CO., LTD., Suwon-si, Gyeonggi-do (KR)

(72) Inventors: An-Soo Park, Suwon-si (KR); Sung-Hoon Kim, Seongnam-si (KR); Pan-Suk Kwak, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/943,861

(22) Filed: Apr. 3, 2018

(65) Prior Publication Data

US 2019/0109149 A1  Apr. 11, 2019

(30) Foreign Application Priority Data

Oct. 11, 2017 (KR) .................. 10-2017-0129762

(51) Int. Cl.
*G11C 11/34* (2006.01)
*H01L 27/11582* (2017.01)
*G11C 16/24* (2006.01)
*G11C 16/04* (2006.01)

(52) U.S. Cl.
CPC .... *H01L 27/11582* (2013.01); *G11C 16/0466* (2013.01); *G11C 16/24* (2013.01)

(58) Field of Classification Search
CPC ........... H01L 27/11582; G11C 16/0466; G11C 16/24
USPC ....................................... 365/182
See application file for complete search history.

(56) References Cited

U.S. PATENT DOCUMENTS

| | | | |
|---|---|---|---|
| 7,679,133 B2 | 3/2010 | Son et al. | |
| 7,867,831 B2 | 1/2011 | Shin et al. | |
| 8,553,466 B2 | 10/2013 | Han et al. | |
| 8,559,235 B2 | 10/2013 | Yoon et al. | |
| 8,644,046 B2 | 2/2014 | Seol et al. | |
| 8,654,587 B2 | 2/2014 | Yoon et al. | |
| 8,750,044 B2 * | 6/2014 | Choi | H01L 29/7926 257/324 |
| 9,219,073 B2 | 12/2015 | Chen | |

(Continued)

FOREIGN PATENT DOCUMENTS

KR  10-0985882 B1  9/2010

*Primary Examiner* — Tha-O H Bui
(74) *Attorney, Agent, or Firm* — Lee & Morse, P.C.

(57) ABSTRACT

A vertical memory device and a method of manufacturing the same, the device including a cell array including cell regions spaced apart from each other in a second direction, each cell region including a regularly arranged plurality of vertical channels; bit-lines extending in the second direction, the bit-lines being spaced apart from each other in a first direction crossing the second direction; and bit-line contacts respectively electrically connecting the vertical channels and the bit-lines, wherein each cell region includes a sub isolation region configured to electrically isolate the cell region in the second direction, the sub isolation region extending in the first direction, the vertical channels are classified into a plurality of types according to a distance from the sub isolation region in the second direction in each cell region, and the bit-line contacts are configured to electrically connect each bit-line to at least two vertical channels having different types.

20 Claims, 17 Drawing Sheets

(56) References Cited

U.S. PATENT DOCUMENTS

| | | |
|---|---|---|
| 9,219,074 B2 | 12/2015 | Chen |
| 9,269,721 B2 | 2/2016 | Seol et al. |
| 9,559,216 B2 * | 1/2017 | Banna ............... H01L 27/11565 |
| 9,773,546 B2 * | 9/2017 | Lee .................... G11C 13/0026 |
| 2011/0233648 A1 | 9/2011 | Seol et al. |
| 2017/0040336 A1 | 2/2017 | Lee et al. |

* cited by examiner

VERTICAL MEMORY DEVICES AND METHODS OF MANUFACTURING VERTICAL MEMORY DEVICES

CROSS-REFERENCE TO RELATED APPLICATION

Korean Patent Application No. 10-2017-0129762, filed on Oct. 11, 2017, in the Korean Intellectual Property Office, and entitled: "Vertical Memory Devices and Methods of Manufacturing Vertical Memory Devices," is incorporated by reference herein in its entirety.

BACKGROUND

1. Field

Embodiments relate to vertical memory devices and methods of manufacturing vertical memory devices.

2. Description of the Related Art

Semiconductor memory devices are used to store data and are classified as volatile memory devices or nonvolatile memory devices. Flash memory devices, which are an example of nonvolatile memory devices, may be used in mobile phones, digital cameras, personal digital assistants (PDAs), portable computers, desktop computers, and other devices. Recently, vertical memory devices have been developed to increase the storage capacity and achieve miniaturization of nonvolatile memory devices. Vertical memory devices include a plurality of memory cells or a plurality of memory cell arrays vertically stacked on a substrate.

SUMMARY

The embodiments may be realized by providing a vertical memory device including a cell array including a plurality of cell regions spaced apart from each other in a second direction, each cell region of the plurality of cell regions including a regularly arranged plurality of vertical channels; a plurality of bit-lines extending in the second direction, the bit-lines being spaced apart from each other in a first direction crossing the second direction; and a plurality of bit-line contacts respectively electrically connecting the plurality of vertical channels and the plurality of bit-lines, wherein each cell region of the plurality of cell regions includes a sub isolation region configured to electrically isolate the cell region in the second direction, the sub isolation region extending in the first direction, wherein the plurality of vertical channels are classified into a plurality of types according to a distance from the sub isolation region in the second direction in each of the cell regions, and wherein the plurality of bit-line contacts are configured to electrically connect each bit-line of the plurality bit-lines to at least two vertical channels having different types.

The embodiments may be realized by providing a vertical memory device including a cell array including a plurality of cell regions spaced apart from each other in a second direction, each cell region of the plurality of cell regions including a regularly arranged plurality of vertical channels and at least one dummy channel; a plurality of bit-lines crossing the cell array in the second direction, the bit-lines being spaced apart from each other in a first direction crossing the second direction; and a plurality of bit-line contacts configured to respectively electrically connect the plurality of vertical channels to the plurality of bit-lines, wherein the plurality of vertical channels are classified into a plurality of types according to a distance in the second direction from at least one sub isolation region that isolates each of the cell regions in the second direction, and wherein the plurality of bit-line contacts are configured to electrically connect each bit-line of the plurality bit-lines to at least two vertical channels having different types in each of the cell regions.

The embodiments may be realized by providing a method of manufacturing a vertical memory device including a cell array including a plurality of cell regions spaced apart from each other in a first direction, each cell region of the plurality of cell regions including a regularly arranged plurality of vertical channels; a plurality of bit-lines extending in a second direction crossing the first direction, the plurality of bit-lines being spaced apart from each other in the first direction; and a plurality of bit-line contacts configured to respectively electrically connect the plurality of vertical channels and the plurality of bit-lines, the method including designing a layout of the vertical memory device; verifying whether loads of the plurality of bit-lines are equalized in the layout; upon verifying that the loads of the bit-lines are equalized, manufacturing a mask for the vertical memory device; and manufacturing the vertical memory device using the mask, wherein the plurality of vertical channels are classified into a plurality of types according to a distance in the second direction from at least one sub isolation region that isolates each of the cell regions in the second direction, and wherein the plurality of bit-line contacts are configured to electrically connect each bit-line of the plurality bit-lines to at least two vertical channels having different types in each of the cell regions.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
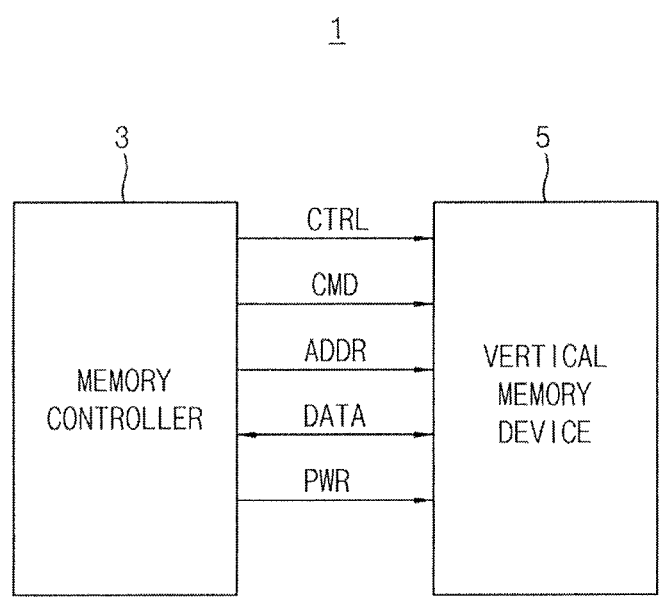
FIG. 1 illustrates a block diagram of a memory system according to exemplary embodiments.

FIG. 1 is a block diagram illustrating a memory system according to exemplary embodiments.

Referring to FIG. 1, a memory system (or, a nonvolatile memory system) 1 may include a memory controller 3 and at least one vertical memory device 5.

The memory system 1 may include flash memory based data storage media such as a memory card, a universal serial bus (USB) memory and solid state drive (SSD).

The vertical memory device 5 may perform an erase operation, a program operation, or a write operation under control of the memory controller 3. The vertical memory device 5 may receive a command CMD, an address ADDR, and data DATA through input/output lines from the memory controller 3 for performing such operations. In addition, the vertical memory device 5 may receive a control signal CTRL through a control line from the memory controller 3. In addition, the vertical memory device 5 may receive a power PWR through a power line from the memory controller 3.

Figure 2:
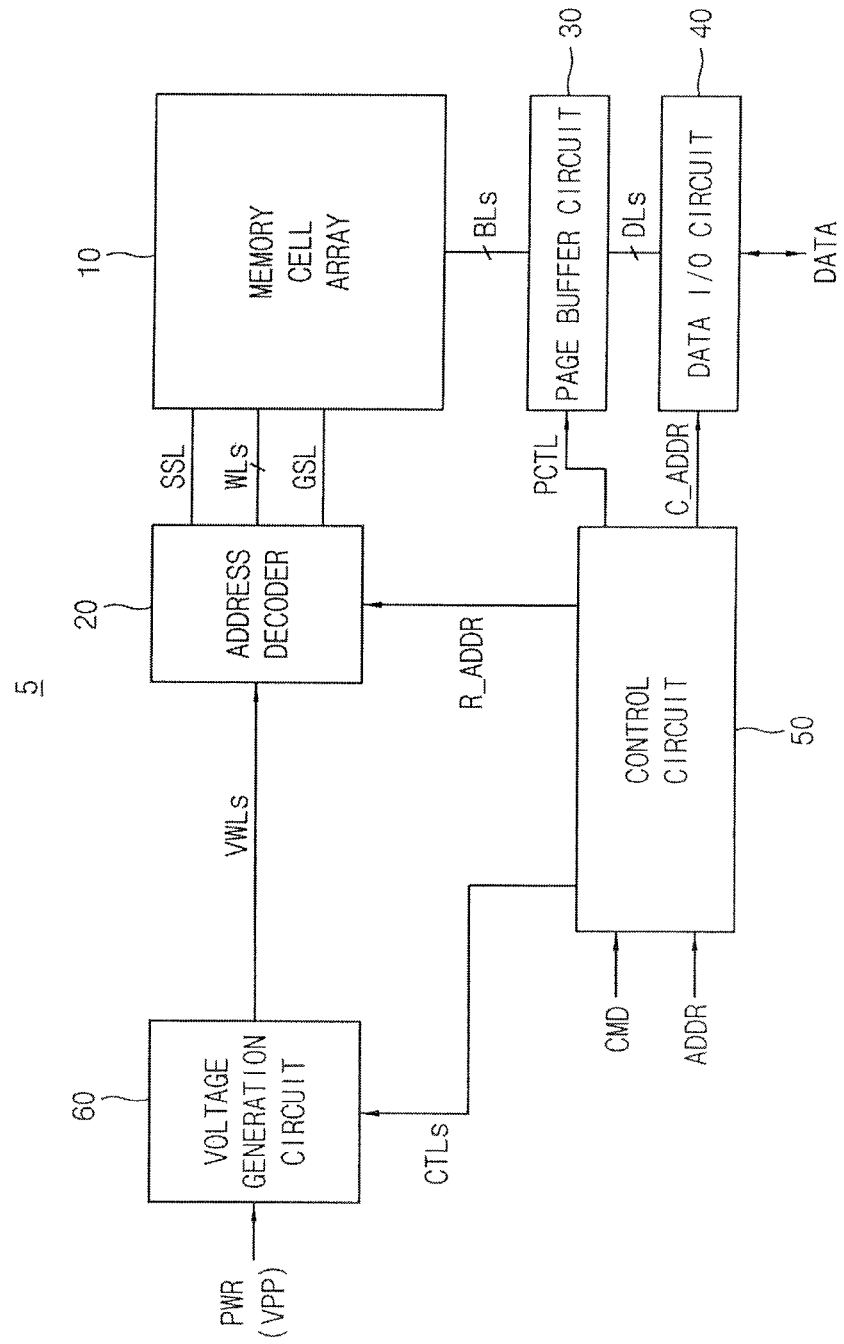
FIG. 2 illustrates a block diagram of the vertical memory device in the memory system of FIG. 1 according to exemplary embodiments.

FIG. 2 illustrates a block diagram of the vertical memory device in the memory system of FIG. 1 according to exemplary embodiments.

Referring to FIG. 2, the vertical memory device 5 may include a memory cell array 10, an address decoder 20, a page buffer circuit 30, a data input/output circuit 40, a control circuit 50, and a voltage generation circuit 60.

The memory cell array 10 may be coupled to the address decoder 20 through a string selection line SSL, a plurality of word-lines WLs, and a ground selection line GSL. In addition, the memory cell array 10 may be coupled to the page buffer circuit 30 through a plurality of bit-lines BLs. The memory cell array 10 may include a plurality of nonvolatile memory cells coupled to the plurality of word-lines WLs and the plurality of bit-lines BLs. The plurality of nonvolatile memory cells may be arranged in the memory cell array 10.

In an implementation, the memory cell array 10 may be a three-dimensional memory cell array, which is formed on a substrate in a three-dimensional structure (or a vertical structure). In this case, the memory cell array 10 may include vertical cell strings that are vertically oriented such that at least one memory cell is located over another memory cell.

Figure 3:
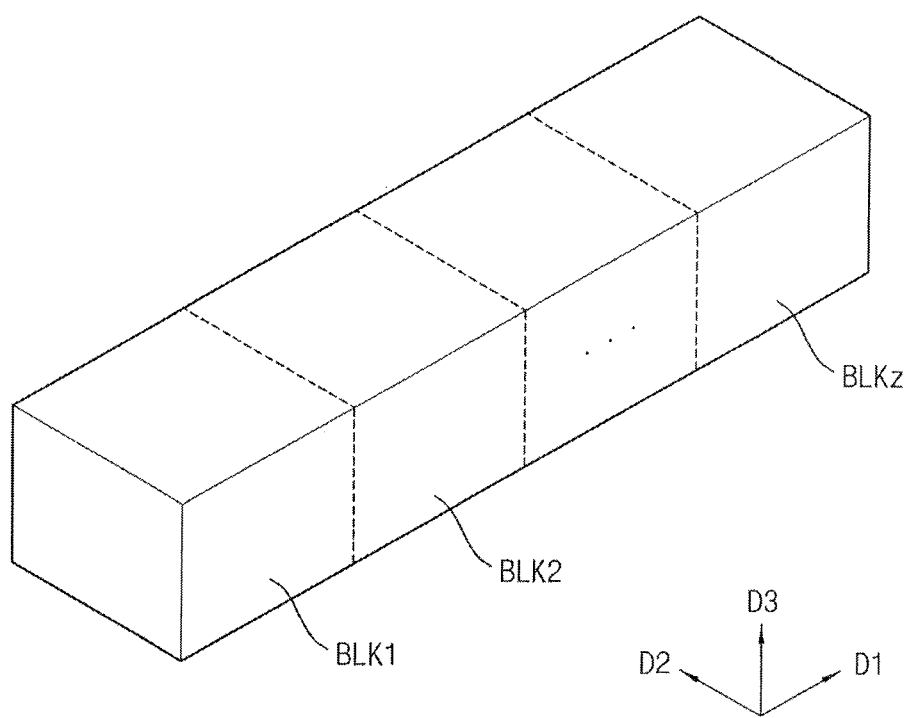
FIG. 3 illustrates a block diagram of the memory cell array in FIG. 2.

FIG. 3 illustrates a block diagram of the memory cell array in FIG. 2.

Referring to FIG. 3, the memory cell array 10 may include a plurality of memory blocks BLK1 to BLKz extending in first through third directions D1, D2 and D3. In an implementation, the memory blocks BLK1 to BLKz may be selected by the address decoder 20 in FIG. 2. For example, the address decoder 20 may select a memory block BLK corresponding to a block address among the memory blocks BLK1 to BLKz.

Figure 4:
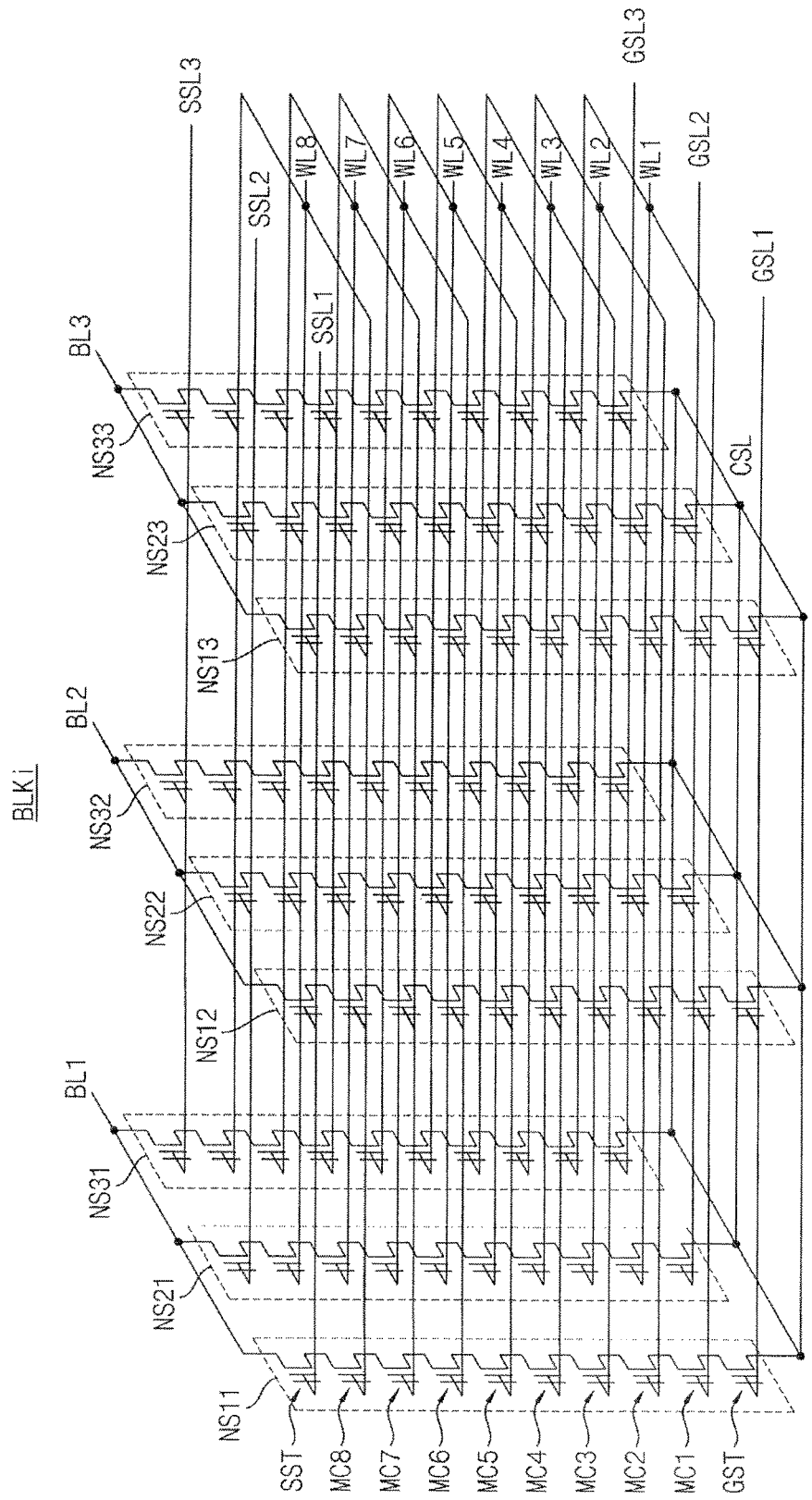
FIG. 4 illustrates a circuit diagram of one of the memory blocks of FIG. 3.

FIG. 4 illustrates a circuit diagram of one of the memory blocks of FIG. 3.

A memory block BLKi of FIG. 4 may be formed on a substrate in a three-dimensional structure (or a vertical structure). For example, a plurality of memory cell strings included in the memory block BLKi may be formed in a direction perpendicular to the substrate.

Referring to FIG. 4, the memory block BLKi may include memory cell strings NS11 to NS33 coupled between bit-lines BL1, BL2, and BL3 and a common source line CSL. Each of the memory cell strings NS11 to NS33 may include a string selection transistor SST, a plurality of memory cells MC1 to MC8, and a ground selection transistor GST. In an implementation, as illustrated in FIG. 4, each of the memory cell strings NS11 to NS33 may include eight memory cells MC1 to MC8. In an implementation, each of the memory cell strings NS11 to NS33 may include any suitable number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be isolated. In an implementation, as illustrated in FIG. 4, the memory block BLKi may be coupled to eight word-lines WL1 to WL8 and three bit-lines BL1 to BL3. In an implementation, the memory cell array 10 may be coupled to any suitable number of word-lines and bit-lines.

Referring back to FIG. 2, the control circuit 50 may receive a command (signal) CMD and an address (signal) ADDR from the memory controller 3 and may control an erase loop, a program loop, and a read operation of the nonvolatile memory device 5 based on the command signal CMD and the address signal ADDR. The program loop may include a program operation and a program verification operation. The erase loop may include an erase operation and an erase verification operation.

For example, the control circuit 50 may generate control signals CTLs, which are used for controlling the voltage generation circuit 60, based on the command signal CMD, and generate a row address R_ADDR and a column address C_ADDR based on the address signal ADDR. The control circuit 50 may provide the row address R_ADDR to the address decoder 20 and provide the column address C_ADDR to the data input/output circuit 40.

The address decoder 20 may be coupled to the memory cell array 10 through the string selection line SSL, the plurality of word-lines WLs, and the ground selection line GSL. During the program operation or the read operation, the address decoder 20 may determine one of the plurality of word-lines WLs as a selected word-line and determine rest of the plurality of word-lines WLs except for the selected word-line as unselected word-lines based on the row address R_ADDR.

The voltage generation circuit 60 may generate word-line voltages VWLs, which are used for the operation of the vertical memory device 5 using the power PWR from the memory controller 3 or the power supply voltage VPP, based on the control signals CTLs from control circuit 50. The word-line voltages VWLs may be applied to the plurality of word-lines WLs through the address decoder 20.

For example, during the erase operation, the voltage generation circuit 60 may apply an erase voltage to a well of the memory block and may apply a ground voltage to entire word-lines of the memory block. During the erase verification operation, the voltage generation circuit 60 may apply an erase verification voltage to the entire word-lines of the memory block or sequentially apply the erase verification voltage to word-lines in a word-line basis.

For example, during the program operation, the voltage generation circuit 60 may apply a program voltage to the selected word-line and may apply a program pass voltage to the unselected word-lines. In addition, during the program verification operation, the voltage generation circuit 60 may apply a program verification voltage to the first word-line and may apply a verification pass voltage to the unselected word-lines.

In addition, during the read operation, the voltage generation circuit 60 may apply a read voltage to the selected word-line and may apply a read pass voltage to the unselected word-lines.

The page buffer circuit 30 may be coupled to the memory cell array 10 through the plurality of bit-lines BLs. The page buffer circuit 30 may include a plurality of page buffers. In an implementation, one page buffer may be connected to one bit-line. In an implementation, one page buffer may be connected to two or more bit-lines.

The page buffer circuit 30 may temporarily store data to be programmed in a selected page during the program operation or data read out from the selected page during the read operation. The page buffer circuit 30 may operate in response to a control signal PCTL from the control circuit 50.

The data input/output circuit 40 may be coupled to the page buffer circuit 30 through data lines DLs. During the program operation, the data input/output circuit 30 may receive program data DATA from the memory controller 20 and provide the program data DATA to the page buffer circuit 30 based on the column address C_ADDR received from the control circuit 450. During the read operation, the data input/output circuit 40 may provide read data DATA, which are stored in the page buffer circuit 30, to the memory controller 20 based on the column address C_ADDR received from the control circuit 50.

In addition, the page buffer circuit 30 and the data input/output circuit 40 may read data from a first area of the memory cell array 10 and may write the read data to a second area of the memory cell array 10. For example, the page buffer circuit 30 and the data input/output circuit 40 may perform a copy-back operation.

Figure 5:
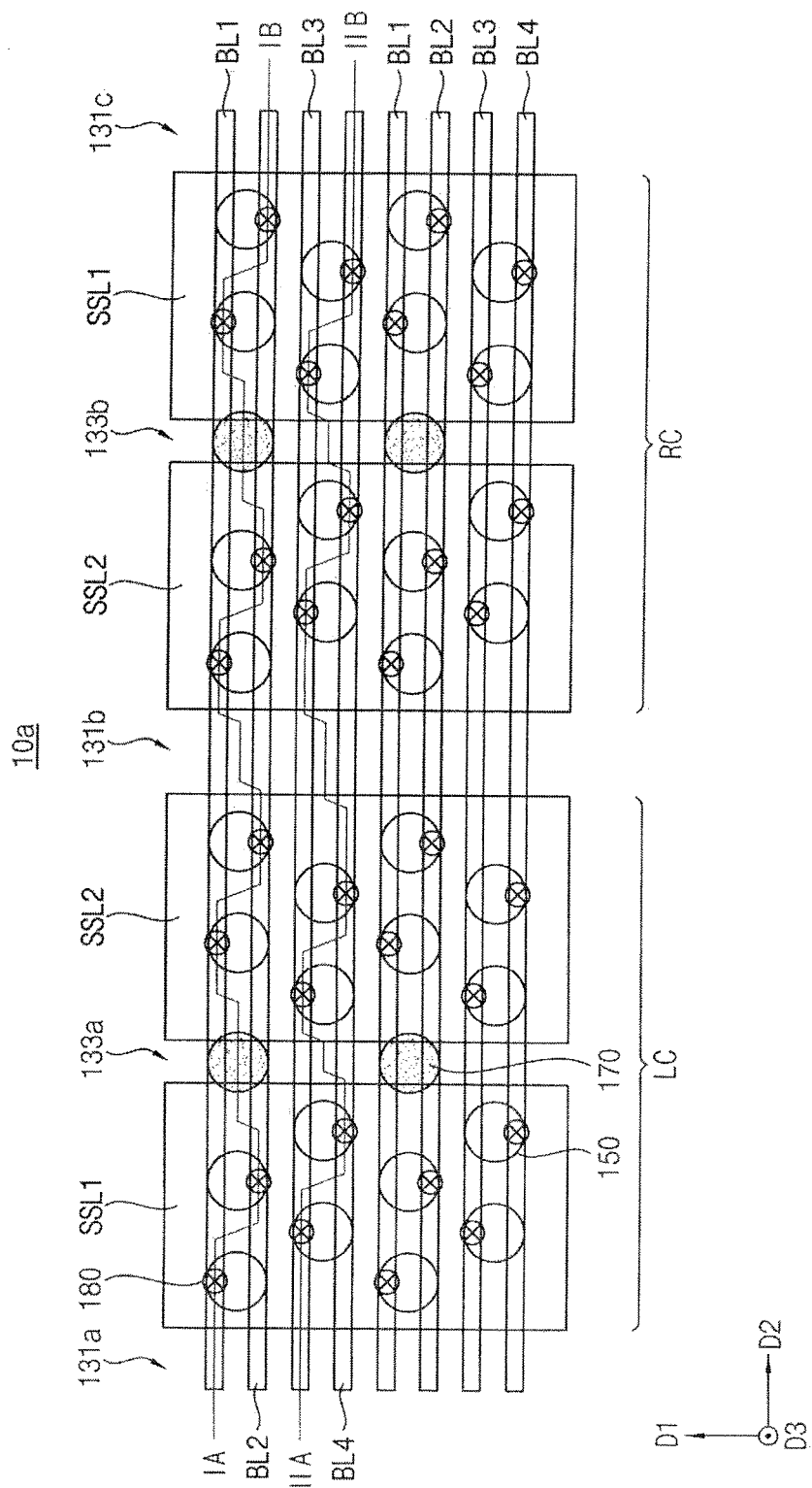
FIG. 5 illustrates a plan view of a vertical memory device according to exemplary embodiments.

FIG. 5 illustrates a plan view of a vertical memory device according to exemplary embodiments.

Figure 6:
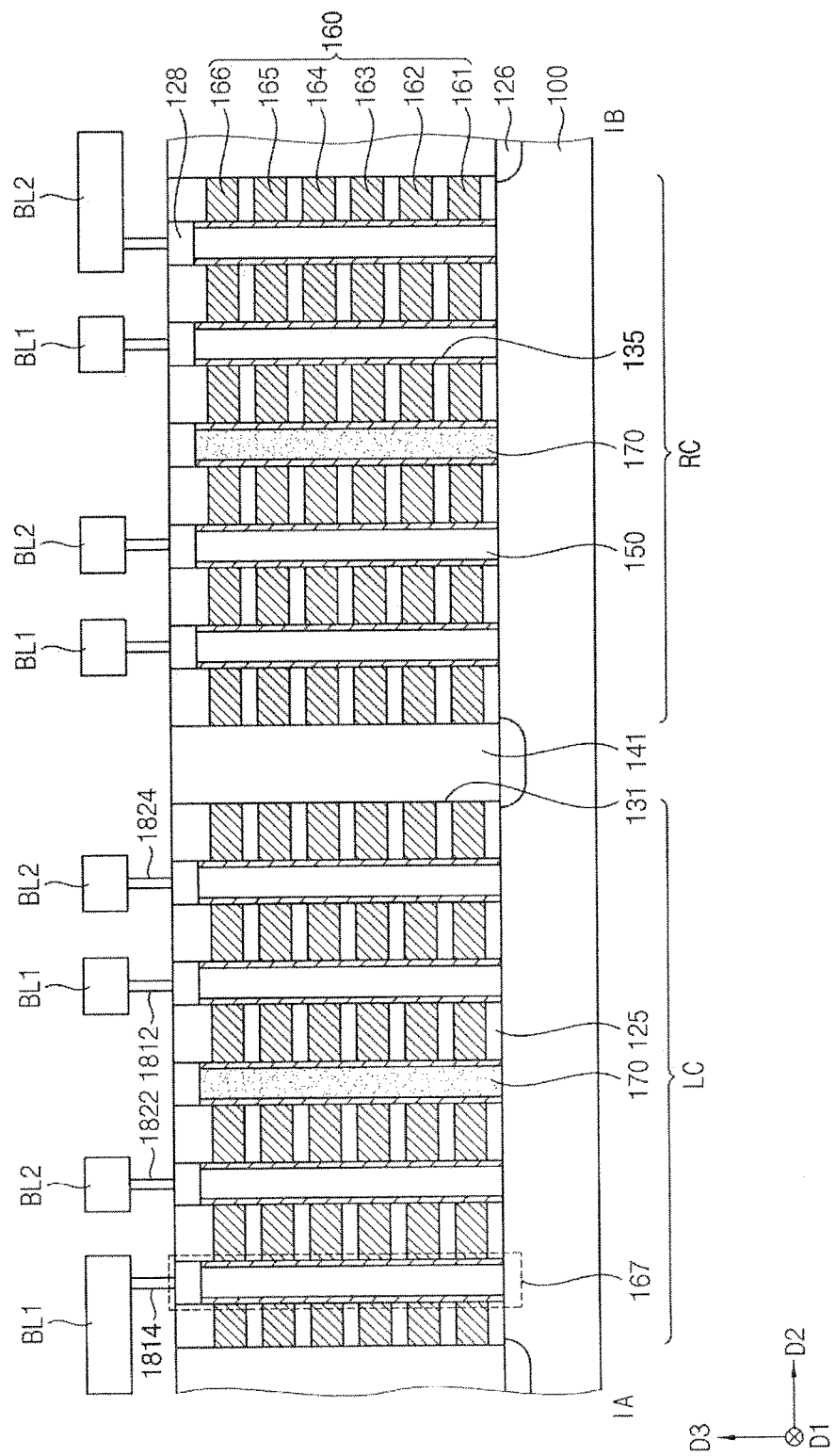
FIG. 6 illustrates a sectional view taken along line IA-IB of the vertical memory device of FIG. 5.

FIG. 6 illustrates a sectional view taken along line IA-IB of the vertical memory device of FIG. 5.

Figure 7:
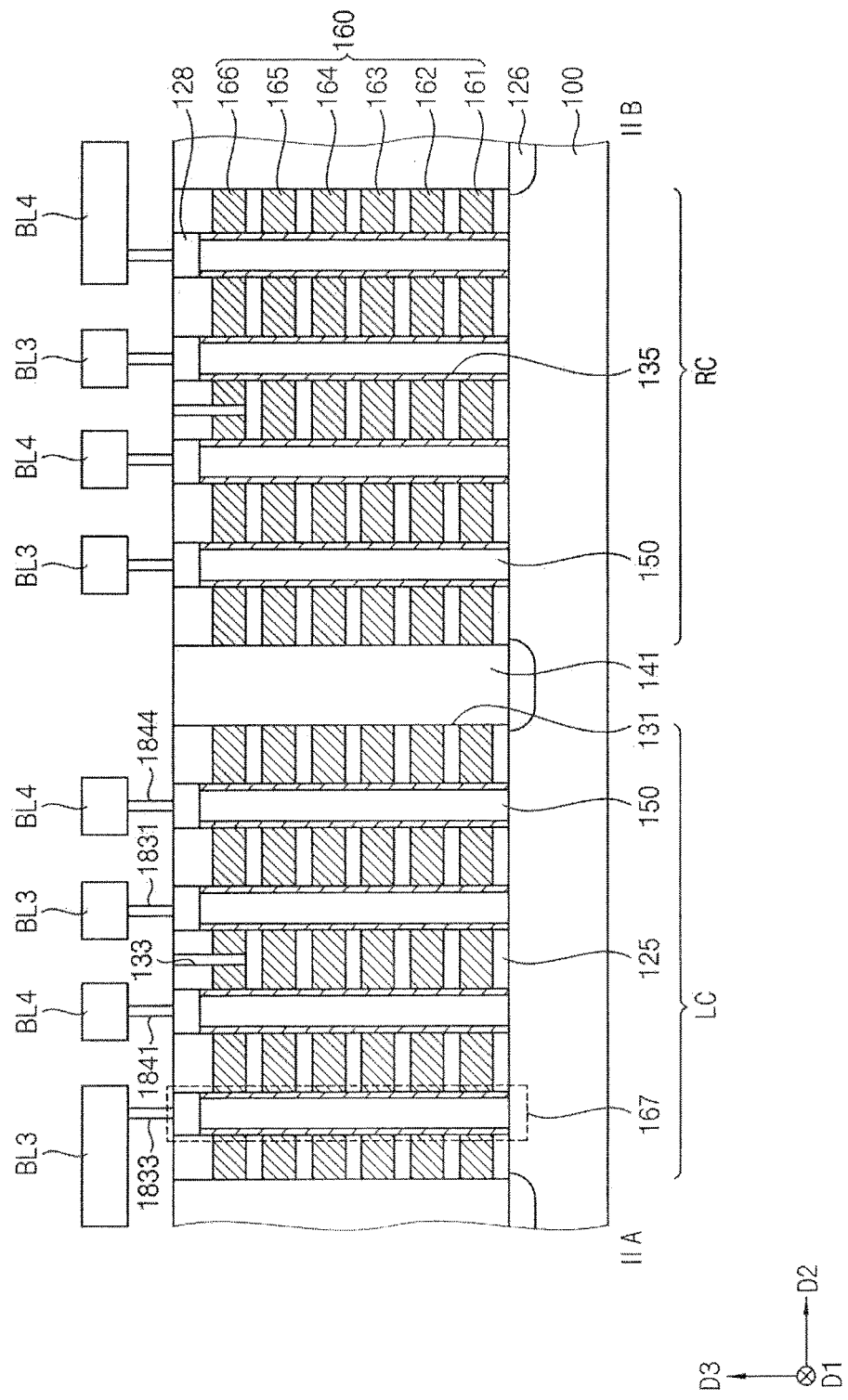
FIG. 7 illustrates a sectional view taken along line IIA-IIB of the vertical memory device of FIG. 5.

FIG. 7 illustrates a sectional view taken along line IIA-IIB of the vertical memory device of FIG. 5.

Referring to FIGS. 5 through 7, a vertical memory device 10a may include a gate stack 160 on a semiconductor substrate 100, vertical channels 150 penetrating the gate stack 160, and bit-lines BL1-BL4 electrically connected to the vertical channels 150. In an implementation, the vertical memory device 10a may include a memory layer 135 extending along the vertical channels 150. In an implementation, the memory layer 135 may include a nitride layer interposed between oxide layers. In an implementation, the memory layer 135 may include a variable resistance layer (e.g., of chalcogen compounds or transition metal oxides). The vertical channels 150 may be also referred to as channel holes.

The bit-lines BL1-BL4 may extend along a second direction D2 parallel to the semiconductor substrate 110 and may be spaced apart from each other in a first direction D1 crossing the second direction D2 and parallel to the semiconductor substrate 110. The vertical channel 150 may extend along a third direction D3 perpendicular to (e.g., a surface of) the semiconductor substrate 110.

The gate stack 160 may include a plurality of cell strings 167 extending in the first direction D1, and here, the cell string 167 may include a plurality of gates 161~166, which are vertically stacked along the vertical channel 150 and are spaced apart from each other by insulating layers 125. The gates 161~66 may include at least one first gate 161, which is provided adjacent to the semiconductor substrate 110 to serve as a ground selection line GSL, at least one sixth gate 166, which is provided adjacent to the bit-lines BL1-BL4 to serve as a string selection line SSL, and second to fifth gates 162~165, which are provided between the ground selection line GSL and the string selection line SSL to serve as the word lines WL. An example in which the gates 161~166 are provided at six different levels will be described to provide understanding of the embodiments. In an implementation, the layer number of the gates may be larger than six.

The vertical memory device 10a may further include word-line cut regions 131a, 131b, and 131c separating the gate stacks 160 from each other in the second direction D2. The word-line cut regions 131a, 131b, and 131c may be referred to as isolation regions. The word-line cut regions 131a, 131b, and 131c may be a trench-shaped structure extending in the first direction D1 and may be filled with an insulating layer 141.

A common source 126 may be provided in a portion of the semiconductor substrate 110 positioned below the insulating layer 141 to serve as a common source line (CSL). The common source 126 may have a conductivity type (e.g., n-type) that is different from a conductivity type (e.g., p-type) of the semiconductor substrate 110. A drain 128 may be provided on or in a top portion of the vertical channel 150 and may have the same conductivity type (e.g., p-type) as that of the common source 126.

The vertical channels 150 may have respective bottom ends, which are electrically connected to the semiconductor substrate 110, and respective top ends, which are electrically connected to the bit-lines BL1-BL4.

The vertical memory device 10a may include a first cell region LC and a second cell region RC which are spaced apart from each other in the second direction D2. The first and second cell regions LC and RC may be spaced apart from each other by the word-line cut region 131b (e.g., therebetween). The first cell region LC may be referred to as a 'left cell region' and the second cell region RC may be referred to as a 'right cell region'. The word-line cut region 131b may be referred to as an isolation region.

In an implementation, the vertical memory device 10a may further include at least one dummy channel 170 having substantially the same structure as the vertical channel 150. For example, each of the left and right cell regions LC and RC may respectively include at least one dummy channel 170. The vertical memory device 10a may be configured to include a plurality of cell arrays which are repeatedly disposed, and each of which has nine channels (e.g., eight vertical channels 150 electrically connected to the bit-lines BL1-BL4 and one dummy channel 170).

In each of the left and right cell regions LC and RC, the sixth gate 166 may be divided into at least two portions. For example, the sixth gate 166 may be divided into a first string selection line SSL1 and a second string selection line SSL2, which are isolated from each other in the second direction D2 by selection line cut regions 133a and 133b extending parallel to the first direction D1 and having a trench shape. The selection line cut regions 133a and 133b may be referred to as sub isolation regions.

The selection line cut regions 133a and 133b may be filled with an insulating layer 143. A plurality of dummy channels 170 may be arranged on the selection-line cut regions 133a and 133b to collectively form a column along the first direction D1. In an implementation, the selection-line cut regions 133a and 133b may be provided to have a width or space that is smaller than that of the word-line cut regions 131a, 131b and 131c, when measured in the second direction D2.

The vertical channels 150 and the dummy channels 170 may be regularly arranged in each of the left and right cell regions LC and RC. As an example, the vertical channels 150 and the dummy channels 170 may be disposed to form a zigzag arrangement along the first direction D1, and such a zigzag arrangement may be repeated in the second direction D2.

The zigzag (e.g., non-linear) arrangement of the vertical channels 150 may allow the vertical memory device 10a to have an increased density, compared with the case of arranging the vertical channels in a line. Furthermore, this may lead to an increase in the number of the vertical channels 150 connected to the string selection lines SSL1 and SSL2 and consequently an increase in page size or depth of the vertical memory device 10a. As a result, it is possible to increase a data size that can be processed at the same time in reading or writing operations and, consequently, to improve performance and/or operation speed of the vertical memory device 10a.

As an example, a most (e.g., closest/directly) adjacent pair of the vertical channels 150 in the first direction D1 (e.g., as illustrated in FIG. 5) may be spaced apart from each other by a distance that is about twice a pitch (hereinafter, bit line pitch) of the bit-lines BL1-BL4. Similarly, a most adjacent pair of the vertical channel 150 and the dummy channels 170 in the first direction D1 may be spaced apart from each other by a distance that is about twice the distance of the bit line pitch. The vertical channels 150 and the dummy channels 170, which are adjacent to each other in the second direction D2, may be arranged in a line and may be spaced apart and equidistant from each other (for example, by about twice the bit line pitch or by a distance different therefrom).

In an implementation, as shown in FIG. 5, the vertical and dummy channels 150 and 170 provided on the right and left cell regions RC and LC may be arranged to have a mirror image or axial symmetry with respect to (e.g., across/about) the second isolation region 131b.

The vertical channels 150 provided on the left cell regions LC may be arranged to have an axial symmetry with respect to a first sub isolation region 133a. The vertical channels 150 provided on the right cell regions RC may be arranged to have an axial symmetry with respect to with respect to a second sub isolation region 133b.

Bit-line contacts 180 provided on the left cell regions LC on an imaginary line parallel to the second direction D2 may be arranged to have a point symmetry with respect to the first sub isolation region 133a by unit of a distance that is about twice the distance of the bit line pitch. Bit-line contacts 180 provided on the right cell regions RC and on the imaginary line may be arranged to have a point symmetry with respect to the second sub isolation region 133b by unit of a distance that is about twice the distance of the bit line pitch. The bit-line contacts provided in the left and right cell regions LC and RC may be arranged to have a point symmetry with respect to the second isolation region 131b.

An adjacent pair (e.g., the first and second bit-lines BL1 and BL2) of the bit-lines BL1-BL4 may be provided on a row of the vertical channels 150 arranged in the second direction D2. Similarly, another adjacent pair (e.g., the third and fourth bit-lines BL3 and BL4) of the bit-lines BL1-BL4 may be provided on another row of the vertical channels 150 arranged in the second direction D2.

The bit-line contacts 180 may be provided on the vertical channels 150. The bit-line contacts 180 may electrically connect the vertical channels 150 to the bit lines BL1-BL4 through the drains 128. The bit-line contacts 180 may not be provided on the dummy channels 170.

Figure 8:
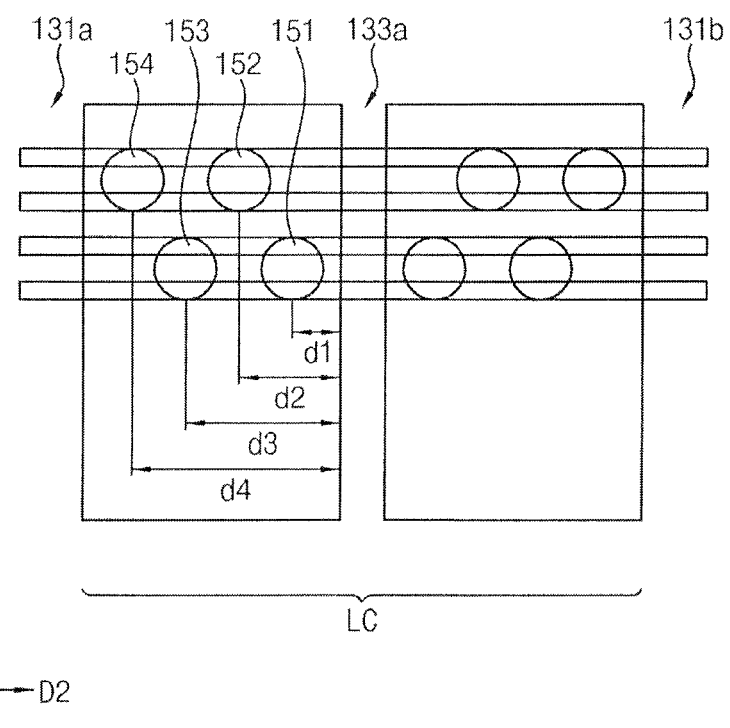
FIG. 8 illustrates a diagram for explaining types of vertical channels in the first cell region, which are classified according to a distance from the first sub isolation region along the second direction.

FIG. 8 is a diagram for explaining types of vertical channels in the first cell region, which are classified according to a distance from the first sub isolation region along the second direction.

Referring to FIG. 8, in the first cell region LC, according to a distance from the first sub isolation region 133a to the first word-line cut region 131a along the second direction D2, it is assumed that a vertical channel 151 having a first distance d1 is classified to have a first type, a vertical channel 152 having a second distance d2 is classified to have a second type, a vertical channel 154 having a third distance d3 is classified to have a third type, and a vertical channel 154 having a fourth distance d4 is classified to have a fourth type. The second distance d2 is greater than the first distance d1, the third distance d3 is greater than the second distance d2 and the fourth distance d4 is greater than the third distance d3.

Referring again to FIGS. 5 through 7, the bit-line contacts 180 may be arranged such that at least two vertical channels having different types are connected to each of the bit-lines BL1-BL4.

Referring to FIG. 6, in the left cell region, LC, a bit-line contact 1814 may connect the first bit-line BL1 to the vertical channel having the fourth type, a bit-line contact 1822 may connect the second bit-line BL2 to the vertical channel having the second type, a bit-line contact 1812 may connect the first bit-line BL1 to the vertical channel having the second type, and a bit-line contact 1824 may connect the second bit-line BL2 to the vertical channel having the fourth type.

Referring to FIG. 7, in the left cell region, LC, a bit-line contact 1833 may connect the third bit-line BL3 to the vertical channel having the third type, a bit-line contact 1841 may connect the fourth bit-line BL4 to the vertical channel having the first type, a bit-line contact 1831 may connect the third bit-line BL3 to the vertical channel having the first type, and a bit-line contact 1844 may connect the fourth bit-line BL4 to the vertical channel having the fourth type.

Therefore, as illustrated in FIGS. 5 to 7, through the bit-line contacts 180, the first bit-line BL1 may be connected to the vertical channels having the second type and the fourth type, the second bit-line BL2 may be connected to the vertical channels having the second type and the fourth type, the third bit-line BL3 may be connected to the vertical channels having the first type and the third type, and the fourth bit-line BL4 may be connected to the vertical channels having the first type and the third type.

Accordingly, each of the first bit-line BL1 and the second bit-line BL2 may be connected to the vertical channels having the second type and the fourth type, and bit-line contacts connecting the first bit-line BL1 and the second bit-line BL2 to corresponding vertical channels may have substantially the same parasitic capacitance. Therefore, each of the first bit-line BL1 and the second bit-line BL2 may have the same bit-line loading. In addition, each of the third bit-line BL3 and the fourth bit-line BL4 may be connected to the vertical channels having the first type and the third type, and bit-line contacts connecting the third bit-line BL3 and the fourth bit-line BL4 to corresponding vertical channels may have substantially the same parasitic capacitance. Therefore, each of the third bit-line BL3 and the fourth bit-line BL4 may have the same bit-line loading.

Figure 9:
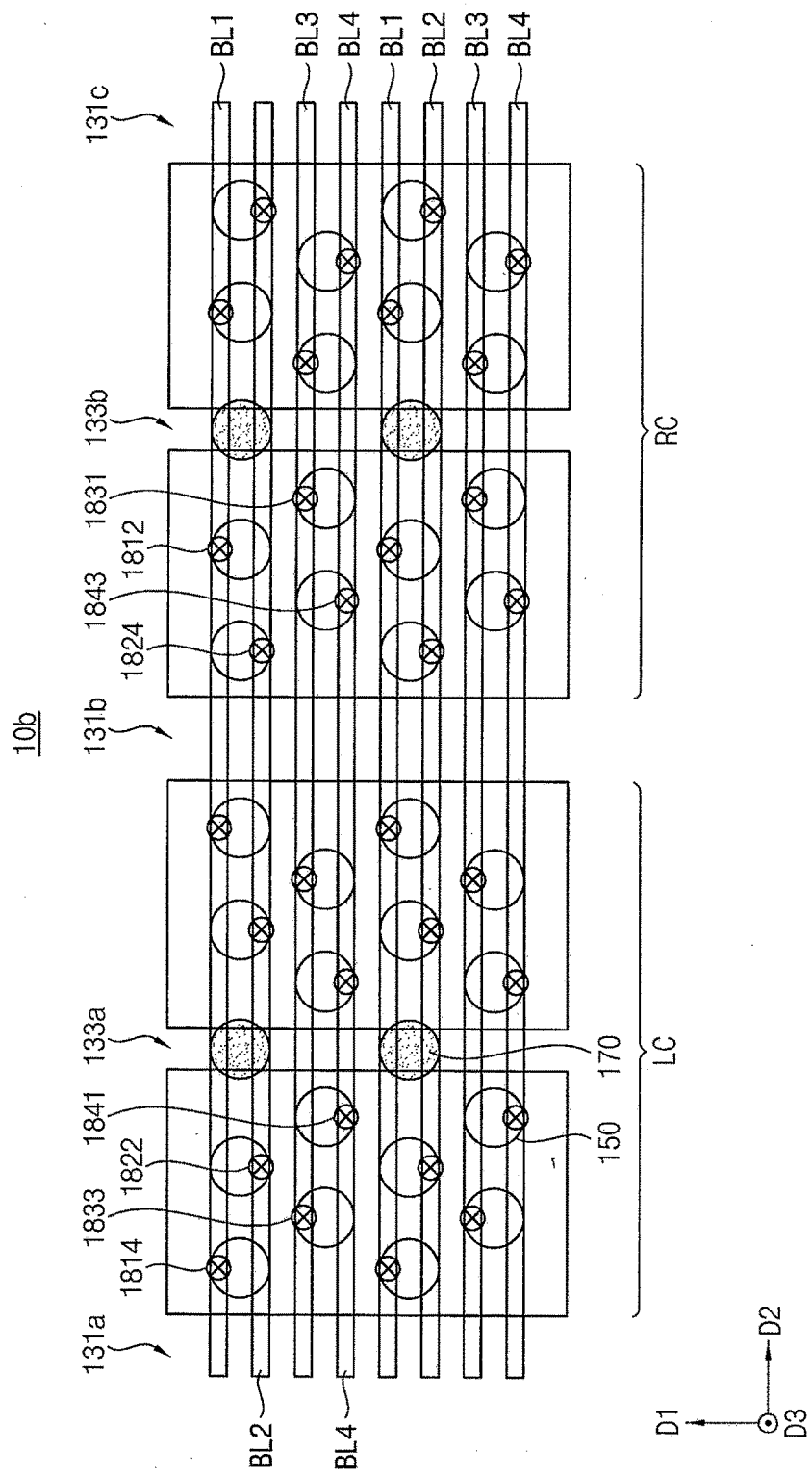
FIG. 9 illustrates a plan view of another vertical memory device according to exemplary embodiments.

FIG. 9 illustrates a plan view of another vertical memory device according to exemplary embodiments.

The vertical memory device 10b of FIG. 9 differs from the vertical memory device 10a of FIG. 5 in that each of the bit-lines BL1~BL4 is connected to vertical channels having different channels. Therefore, similar description may be omitted.

Referring to FIGS. 8 and 9, in the left cell region LC, a bit-line contact 1814 may connect the first bit-line BL1 to the vertical channel having the fourth type, a bit-line contact 1822 may connect the second bit-line BL2 to the vertical channel having the second type, a bit-line contact 1833 may connect the third bit-line BL3 to the vertical channel having the third type, and a bit-line contact 1841 may connect the fourth bit-line BL4 to the vertical channel having the first type.

In addition, in the right cell region RC, a bit-line contact 1812 may connect the first bit-line BL1 to the vertical channel having the second type, a bit-line contact 1824 may connect the second bit-line BL2 to the vertical channel having the fourth type, a bit-line contact 1831 may connect the third bit-line BL3 to the vertical channel having the first type, and a bit-line contact 1843 may connect the fourth bit-line BL4 to the vertical channel having the third type.

The vertical channels 150 provided on the left cell regions LC may be arranged to have an axial symmetry with respect to the first sub isolation region 133a. The bit-line contacts 1814, 1822, 1833 and 1841 provided on the left cell regions LC may be arranged to have a point symmetry with respect to the first sub isolation region 133a.

The vertical channels 150 provided on the right cell regions RC may be arranged to have an axial symmetry with respect to the second sub isolation region 133b. The bit-line contacts 1812, 1824, 1831, and 1843 provided on the right cell regions RC may be arranged to have an axial symmetry with respect to the second sub isolation region 133a.

The bit-line contacts 1814, 1822, 1833, and 1841 provided on the left cell regions LC and on an imaginary line parallel to the second direction D2 and the bit-line contacts 1812, 1824, 1831, and 1843 provided on the right cell regions RC and on the imaginary line may be arranged to have a point symmetry with respect to the second isolation region 131b by unit of a distance that is about twice the distance of the bit line pitch.

Therefore, each of the first bit-line BL1 and the second bit-line BL2 may be connected to the vertical channels having the second type and the fourth type, and bit-line contacts connecting the first bit-line BL1 and the second bit-line BL2 to corresponding vertical channels may have substantially the same parasitic capacitance. Therefore, each of the first bit-line BL1 and the second bit-line BL2 may have the same bit-line loading.

In addition, each of the third bit-line BL3 and the fourth bit-line BL4 may be connected to the vertical channels having the first type and the third type, and bit-line contacts connecting the third bit-line BL3 and the fourth bit-line BL4 to corresponding vertical channels may have substantially the same parasitic capacitance. Therefore, each of the third bit-line BL3 and the fourth bit-line BL4 may have the same bit-line loading.

Figure 10:
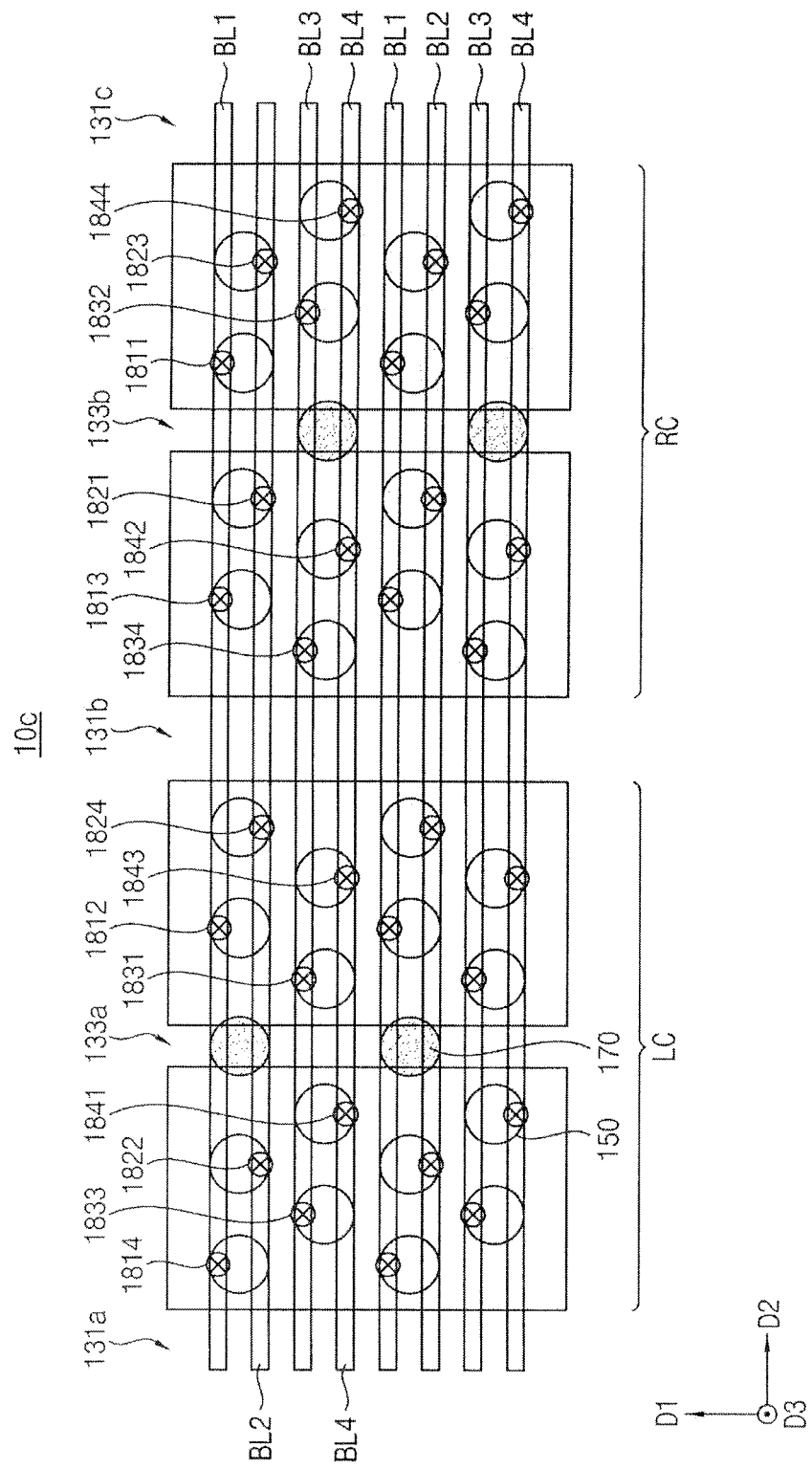
FIG. 10 illustrates a plan view of still another vertical memory device according to exemplary embodiments.

FIG. 10 illustrates a plan view of still another vertical memory device according to exemplary embodiments.

The vertical memory device 10c of FIG. 10 differs from the vertical memory device 10a of FIG. 5 in that each of the bit-lines BL1~BL is connected to vertical channels having different channels and channels provided on the second cell region RC has different arrangement from the chancels in the second region RC in FIG. 5. Similar description may be omitted.

Referring to FIGS. 8 and 10, in the left cell region LC, a bit-line contact 1814 may connect the first bit-line BL1 to the vertical channel having the fourth type, and a bit-line contact 1812 may connect the first bit-line BL1 to the vertical channel having the second type. A bit-line contact 1822 may connect the second bit-line BL2 to the vertical channel having the second type, and a bit-line contact 1824 may connect the second bit-line BL2 to the vertical channel having the fourth type. A bit-line contact 1833 may connect the third bit-line BL3 to the vertical channel having the third type, and a bit-line contact 1831 may connect the third bit-line BL3 to the vertical channel having the first type. A bit-line contact 1841 may connect the fourth bit-line BL4 to the vertical channel having the first type, and a bit-line contact 1843 may connect the fourth bit-line BL4 to the vertical channel having the third type.

In addition, in the right cell region RC, a bit-line contact 1813 may connect the first bit-line BL1 to the vertical channel having the third type, and a bit-line contact 1811 may connect the first bit-line BL1 to the vertical channel having the first type. A bit-line contact 1821 may connect the second bit-line BL2 to the vertical channel having the first type, and a bit-line contact 1823 may connect the second bit-line BL2 to the vertical channel having the third type. A bit-line contact 1834 may connect the third bit-line BL3 to the vertical channel having the fourth type, and a bit-line contact 1832 may connect the third bit-line BL3 to the vertical channel having the second type. A bit-line contact 1842 may connect the fourth bit-line BL4 to the vertical channel having the second type, and a bit-line contact 1844 may connect the fourth bit-line BL4 to the vertical channel having the forth type.

The vertical channels 150 provided on the left cell regions LC may be arranged to have a mirror image (or an axial symmetry) with respect to the first sub isolation region 133a. The bit-line contacts 1814, 1833, 1822 and 1841 and the bit-line contacts 1824, 1843, 1812 and 1831 provided on the left cell regions LC and in a row along the second direction D2 may be arranged to have point symmetry with respect to the first sub isolation region 133a.

The vertical channels 150 provided on the right cell regions RC may be arranged to have a mirror image with respect to the second sub isolation region 133b. The bit-line contacts 1834, 1813, 1842 and 1821 and the bit-line contacts 1844, 1823, 18132 and 1811 provided on the right cell regions RC and in a row along the second direction D2 may be arranged to have a point symmetry with respect to the second sub isolation region 133b.

The vertical channels 150 and the dummy channels 170 provided on the left cell region LC and the right cell region RC and on an imaginary line parallel to the second direction D2 may be arranged to have a point symmetry with respect to the second isolation region 131b. In addition, the bit-line contacts provided on the left cell regions LC and on the imaginary line and the bit-line contacts provided on the right cell regions RC and on the imaginary line may be arranged to have a point symmetry with respect to the second isolation region 131b by unit of a distance that is about twice the distance of the bit line pitch.

Therefore, when considering the left cell region LC and the right cell region RC, each of the first to fourth bit-lines BL1~BL4 may be connected to the vertical channels having the first to fourth types through corresponding bit-line contacts. Therefore, the bit-line contacts may have substantially the same coupling capacitance, and each of the first to fourth bit-lines BL1~BL4 may have the same bit-line loading.

Figure 11:
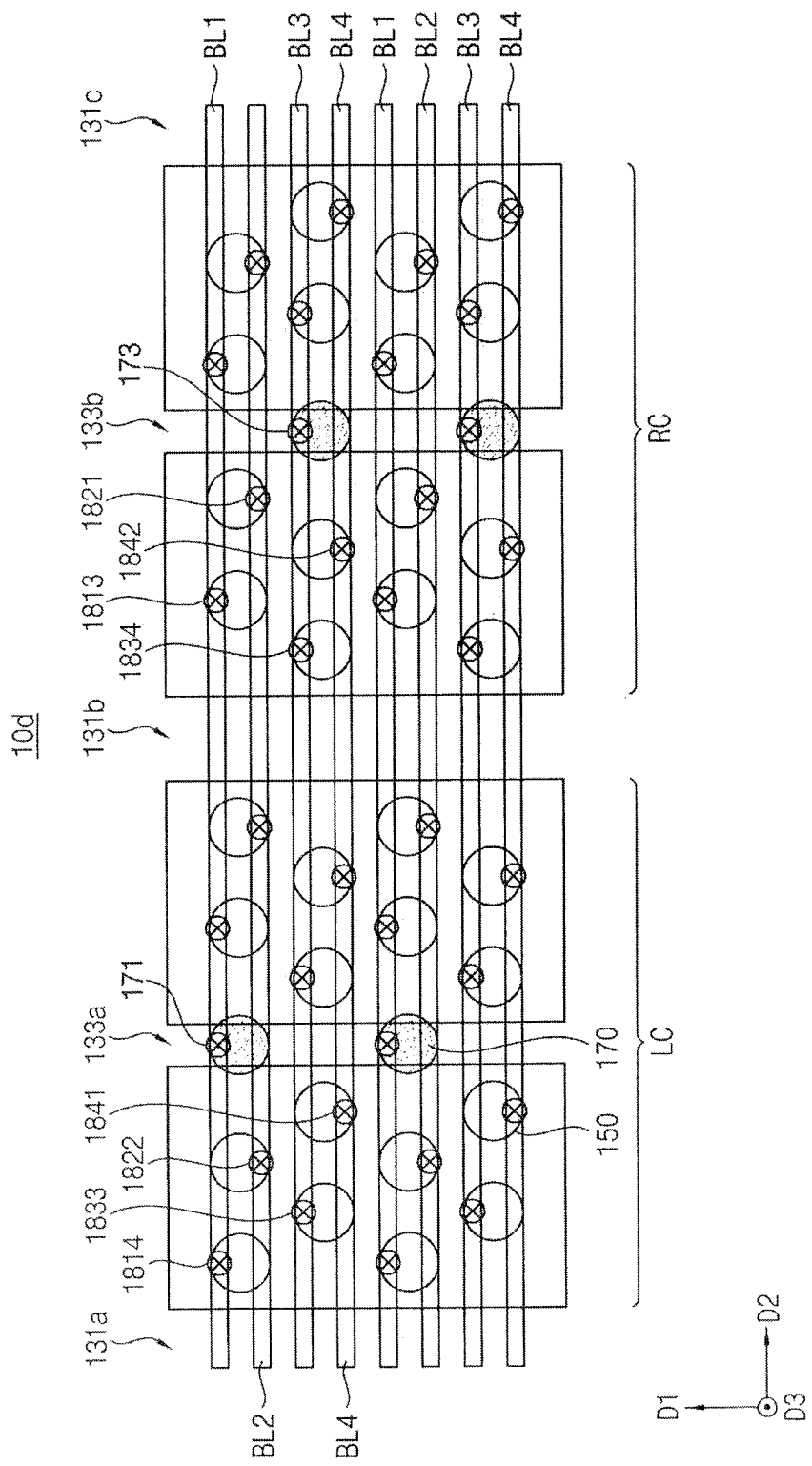
FIG. 11 illustrates a plan view of still another vertical memory device according to exemplary embodiments.

FIG. 11 illustrates a plan view of still another vertical memory device according to exemplary embodiments.

A vertical memory device 10d of FIG. 11 differs from the vertical memory device 10c of FIG. 10 in that dummy contacts 171 and 173 are provided on the dummy channels 170. Therefore, similar description may be omitted.

Referring to FIG. 11, in the left cell region LC of the vertical memory device 10d, at least one dummy contact 171 may be formed on the dummy channel 170, and in the right cell region RC, at least one dummy contact 173 may be formed on the dummy channel 170. The dummy contacts 171 and 173 may not be connected to the bit-lines BL1~BL4 and may provide coupling capacitance to adjacent bit-line contacts. Therefore, the bit-line contacts connected to each of the first to fourth bit-lines BL1~BL4 may have substantially the same coupling capacitance, and each of the first to fourth bit-lines BL118 BL4 may have the same bit-line loading.

The dummy contacts 171 and 173 described with reference to FIG. 11 may be provided in the vertical memory device 10a and the vertical memory device 10b of FIG. 9.

Each of the vertical memory devices 10a, 10b, 10c and 10d of FIGS. 5, 9, 10 and 11 may correspond to the memory cell array (or, a cell array) 10 in the vertical memory device 5 of FIG. 2.

Figure 12:
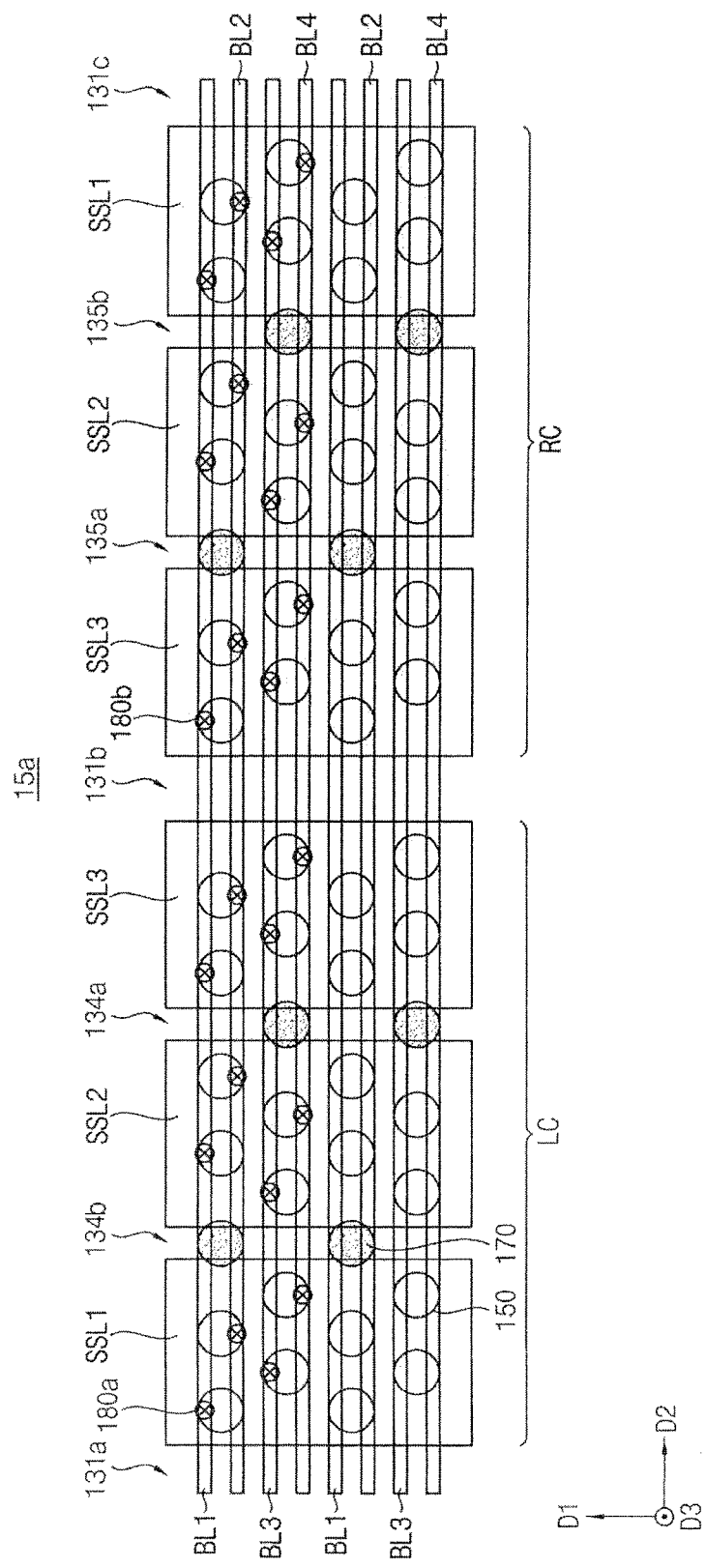
FIG. 12 illustrates a plan view of a vertical memory device according to exemplary embodiments.

FIG. 12 illustrates a plan view of a vertical memory device according to exemplary embodiments.

A vertical memory device 15a of FIG. 12 differs from the vertical memory device 10a of FIG. 5 in that the left cell region LC may be isolated in the second direction D2 by a first sub isolation region 134a and a second sub isolation region 134b and the right cell region RC may be isolated in the second direction D2 by a third sub isolation region 134a and a fourth sub isolation region 135b.

The first sub isolation region 134a may isolate a string selection line SSL3 and the string selection line SSL2 and the second sub isolation region 134b may isolate the string selection line SSL2 and the string selection line SSL1. The third sub isolation region 135a may isolate the string selection line SSL3 and the string selection line SSL2 and the fourth sub isolation region 135b may isolate the string selection line SSL2 and the string selection line SSL1.

The vertical channels 150 provided on the left cell regions LC may be arranged to have an axial symmetry with respect to the first sub isolation region 134a and the second sub isolation region 134b. The vertical channels 150 provided on the right cell regions RC may be arranged to have an axial symmetry with respect to the third sub isolation region 135a and the fourth sub isolation region 135b.

The vertical channels 150 and the dummy channels 170 provided on the left cell region LC and on the right cell region RC may be arranged to have a point symmetry with respect to the second isolation region 131b along the second direction D2.

Bit-line contacts 180a in the left cell region LC and the bit-line contacts 180b in the right cell region RC may be arranged to have a point symmetry with respect to the second isolation region 131b along the second direction D2. Therefore, the bit-line contacts 180a and 180b may electrically connect each of the bit-lines BL1~BL4 to at least two vertical channels having different types. Therefore, the bit-line contacts 180a and 180b may have substantially the same coupling capacitance, and each of the first to fourth bit-lines BL1~BL4 may have the same bit-line loading.

Figure 13:
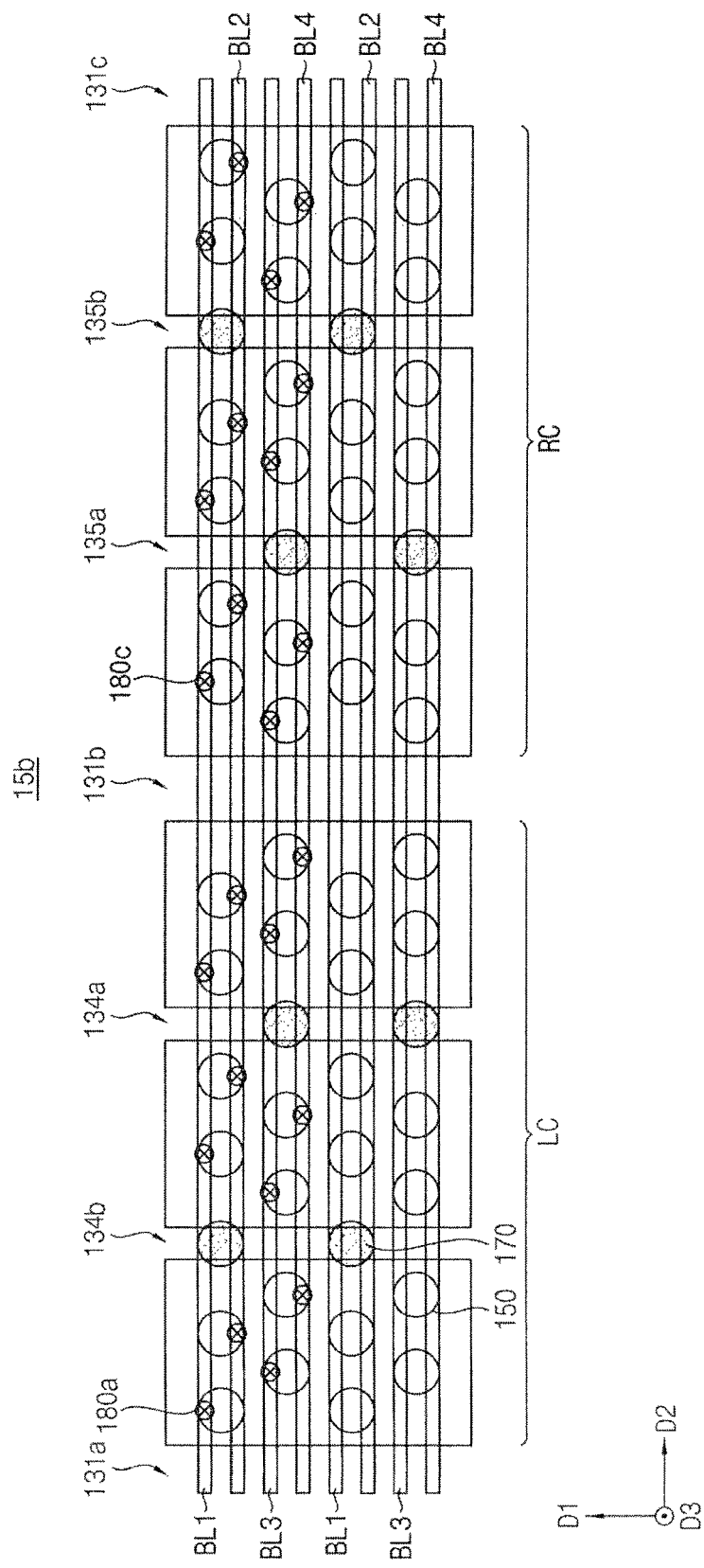
FIG. 13 illustrates a plan view of another vertical memory device according to exemplary embodiments.

FIG. 13 illustrates a plan view of another vertical memory device according to exemplary embodiments.

A vertical memory device 15b of FIG. 13 differs from the vertical memory device 15a of FIG. 12 in that the channels 150 and 170 and bit-lines contacts 180c provided on the right cell region RC may have different arrangement from the chancels 150 and 170 and the bit-line contacts 180b in the right cell region RC in FIG. 12.

Referring to FIG. 13, vertical channels 150 and the dummy channels 170 provided on the left cell region LC and on the right cell region RC may be arranged to have an axial symmetry with respect to the second isolation region 131b.

The bit-line contacts 180a in the left cell region LC and the bit-line contacts 180b in the right cell region RC may be arranged to have a point symmetry with respect to the second isolation region 131b along the second direction D2. Therefore, the bit-line contacts 180a and 180c may electrically connect each of the bit-lines BL1~BL4 to at least two vertical channels having different types. Therefore, the bit-line contacts 180a and 180b may have substantially the same coupling capacitance, and each of the first to fourth bit-lines BL1~BL4 may have the same bit-line loading.

Figure 14:
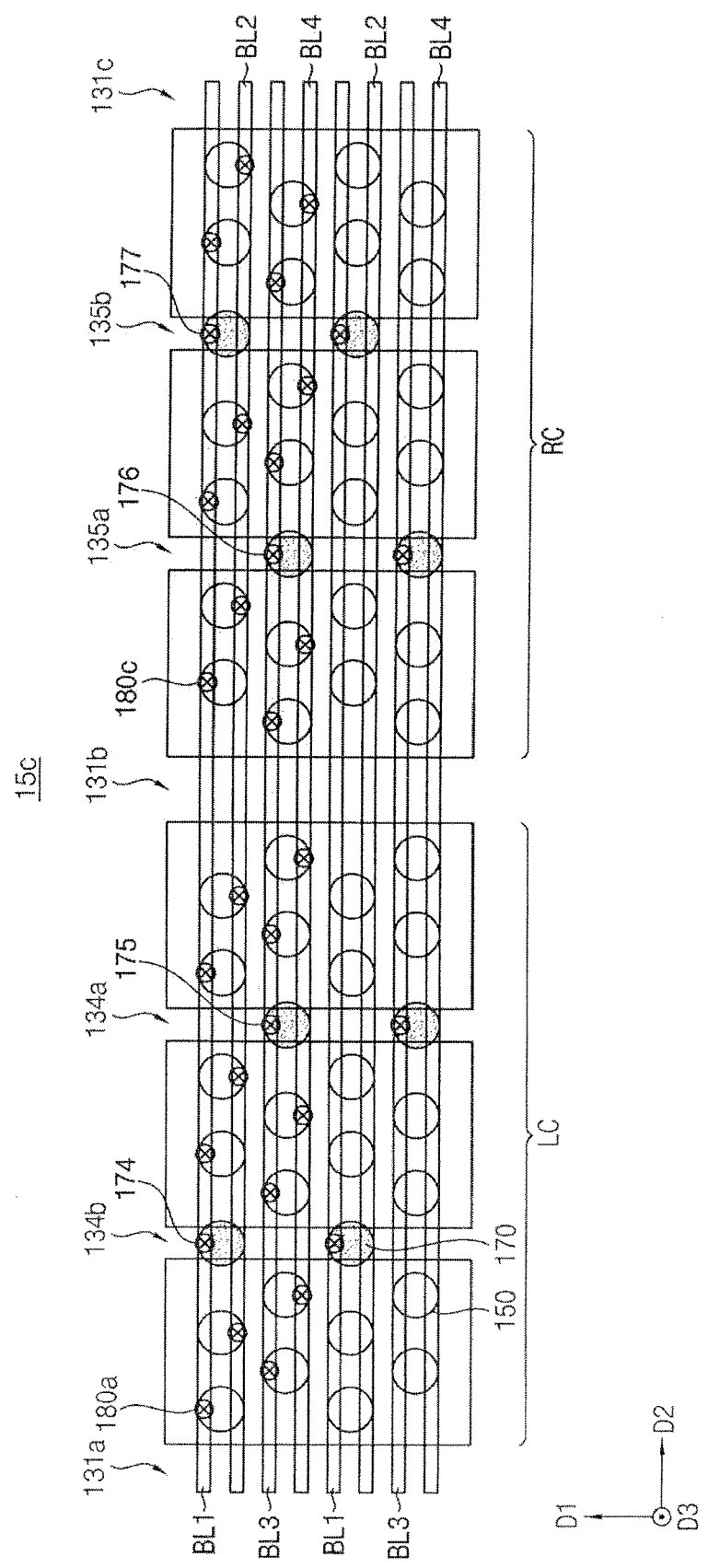
FIG. 14 illustrates a plan view of still another vertical memory device according to exemplary embodiments.

FIG. 14 illustrates a plan view of still another vertical memory device according to exemplary embodiments.

A vertical memory device 15c of FIG. 14 differs from the vertical memory device 15b of FIG. 13 in that the vertical memory device 15c may further include dummy contacts 174 and 175 and dummy contacts 176 and 177. The dummy contacts 174 and 175 may be formed on the dummy channels 170 provided on the first sub isolation region 134a and the second sub isolation region 134b and the dummy contacts 176 and 177 may be formed on the third sub isolation region 134a and a fourth sub isolation region 135b.

The dummy contacts 174, 175, 176 and 177 may not be connected to the bit-lines BL1~BL4.

Therefore, the bit-line contacts 180a and 180c may electrically connect each of the bit-lines BL1~BL4 to at least two vertical channels having different types. Therefore, the bit-line contacts 180a and 180b may have substantially the same coupling capacitance, and each of the first to fourth bit-lines BL1~BL4 may have the same bit-line loading.

Each of the vertical memory devices 15a, 15b, and 15c of FIGS. 12, 13 and 14 may correspond to the memory cell array (or, a cell array) 10 in the vertical memory device 5 of FIG. 2.

Figure 15:
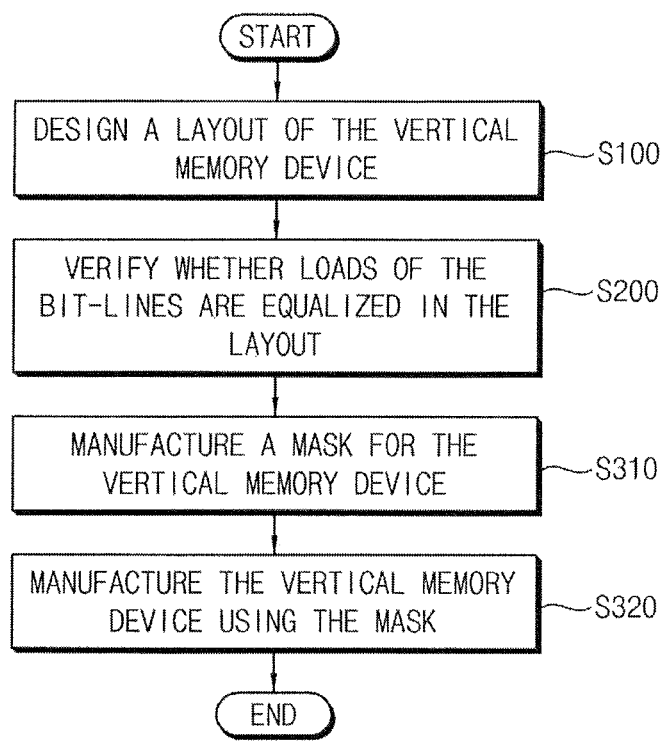
FIG. 15 illustrates a flowchart of a method of manufacturing a vertical memory device according to exemplary embodiments.

FIG. 15 illustrates a flowchart of a method of manufacturing a vertical memory device according to exemplary embodiments.

Referring to FIGS. 5 through 14, in a method of manufacturing a vertical memory device, a layout of a vertical memory device may be designed (S100). The vertical memory device, as described with reference to FIGS. 5 through 14, may include a plurality of cell region, each including a plurality of vertical channels spaced apart in a first direction and regularly arranged, a plurality of bit-lines extending a second direction crossing the first direction and spaced apart in the first direction and a plurality of bit-line contacts that electrically connect the vertical channels to the bit-lines.

The layout may be a physical structure that allows designed circuits for the vertical memory device to be transferred on a wafer and may include a plurality of patterns. The patterns may correspond to circuits directly associated with operations of the vertical memory device, interconnections, etc.

Whether loads of bit-lines in the layout are equalized may be verified (S200) by using, e.g., a verification tool. The verification tool may receive layout data and verify whether the loads of the bit lines are equalized, based on the received layout data. For example, the verification tool may include software that includes a plurality of instructions executable on a processor and may be stored in a non-transitory computer-readable storage medium.

In an implementation, whether the loads of the bit-lines are equalized may be verified by checking whether types of a plurality of channel holes connected to each bit line are regularly distributed. In the vertical memory device, characteristics of memory cells formed in channel holes may vary according to a distance between each channel hole and an isolation region (e.g., a word-line cut region) adjacent thereto. Accordingly, load mismatch among bit lines may cause a decrease in an operating speed and performance of the vertical memory device.

In an implementation, whether the loads of the bit-lines in the layout are equalized may be verified. If a verification result indicates that the loads of the bit-lines are equalized, the vertical memory device may be formed based on the verified layout. Otherwise, loads of the bit-lines may be equalized by changing a route between a bit-line and a channel hole.

A mask may be manufactured based on passed layout (S310). An optical proximity correction (OPC) operation or a post-simulation operation may be performed between operation S200 and operation S310. The OPC operation may be an operation of changing patterns in the layout to correct an error due to an optical proximity effect (OPE). The mask may be manufactured by performing an exposure process on a substrate for the mask by using a pattern of the layout or a corrected pattern thereof. After the exposure process, the mask may be manufactured by further performing a series of processes such as a development process, an etching process, a cleaning process, and a bake process.

The vertical memory device may be formed by performing various semiconductor processes on a semiconductor substrate (e.g., a wafer) by using the mask (S320). For example, the mask may be used when performing a patterning process by using a lithography process. A target pattern may be formed on the semiconductor substrate or a material layer by the patterning process.

The semiconductor processes may include, e.g., a deposition process, an etching process, an ion process, a cleaning process, etc. The deposition process may include various processes for forming a material layer, e.g., a chemical vapor deposition (CVD) process, a sputtering process, and/or a spin coating process. The ion process may include an ion implantation process, a diffusion process, an annealing process, etc. Furthermore, the semiconductor processes may include a packing process in which a semiconductor device is mounted on a printed circuit board (PCB) and is mold with a molding member and a test process in which the semiconductor device or the package is tested.

Figure 16:
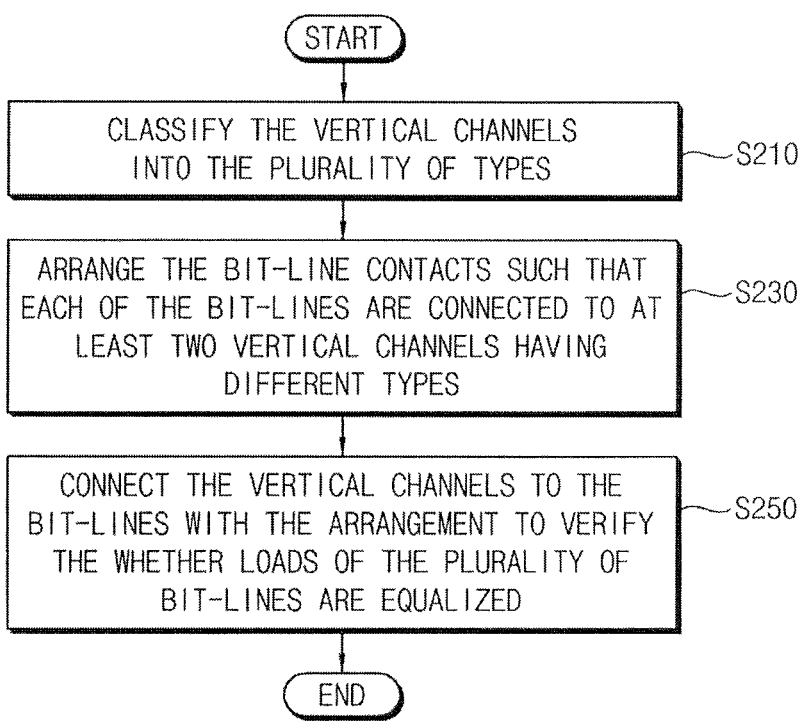
FIG. 16 illustrates a flowchart of a method of verifying a layout of a vertical memory device according to exemplary embodiments.

FIG. 16 illustrates a flowchart of a method of verifying a layout of a vertical memory device according to exemplary embodiments.

Referring to FIG. 16, the layout verifying method of FIG. 16 may correspond to one embodiment of operation S200 of FIG. 15.

Referring to FIGS. 5 through 16, the vertical channels 150 in the layout of the vertical memory device may be classified into a plurality of types according to a distance from the sub isolation regions 133a and 133b in the second direction D2. The sub isolation regions 133a and 133b may isolate the cell regions LC and RC in the first direction D1 crossing the second direction D2. As described with reference to FIG. 8, the vertical channels 150 may have one of first through fourth types according to a distance from each of the sub isolation regions 133a and 133b. The vertical channels in the layout may be classified into a plurality of types (S210).

Bit-line contacts 180 may be arranged such that each of the bit-lines BL1~BL4 is connected to at least two vertical channels having different types. The arrangement of the vertical channels 150, the dummy channels 170, and the bit-line contacts 180 may be implemented one of FIGS. 5, and 9 through 14.

The vertical channels 150 may be connected to the bit-lines BL1~BL4 by the bit-line contacts 180 with the arrangement and whether loads of bit-lines BL1~BL4 are equalized is verified (S250). Therefore, the loads of the bit-lines BL1~BL4 may be equalized by connecting each of the bit-lines BL1~BL4 to at least two vertical channels having different types through the bit-line contacts such that the bit-line contacts have substantially the same coupling capacitance.

The layout verifying method described with reference to FIG. 16 may be implemented in the form of a program instruction(s) that is executable on various computers and may be recorded in a non-transitory computer-readable medium. The non-transitory computer-readable medium may include program instructions, data files, data structures, etc. independently or may include a combination thereof. The program instruction(s) recorded in the medium may be specially designed and configured for the embodiments or may also be known and available to those skilled in computer software.

The non-transitory computer-readable medium may include hardware devices, which are specially configured to store and execute program instructions, such as magnetic media, optical recording media (e.g., CD-ROM and DVD), magneto-optical media (e.g., a floptical disk), read only memories (ROMs), random access memories (RAMs), and flash memories. Examples of computer programs include not only machine language codes created by a compiler, but also high-level language codes that are capable of being executed by a computer by using an interpreter or the like. 1

Figure 17:
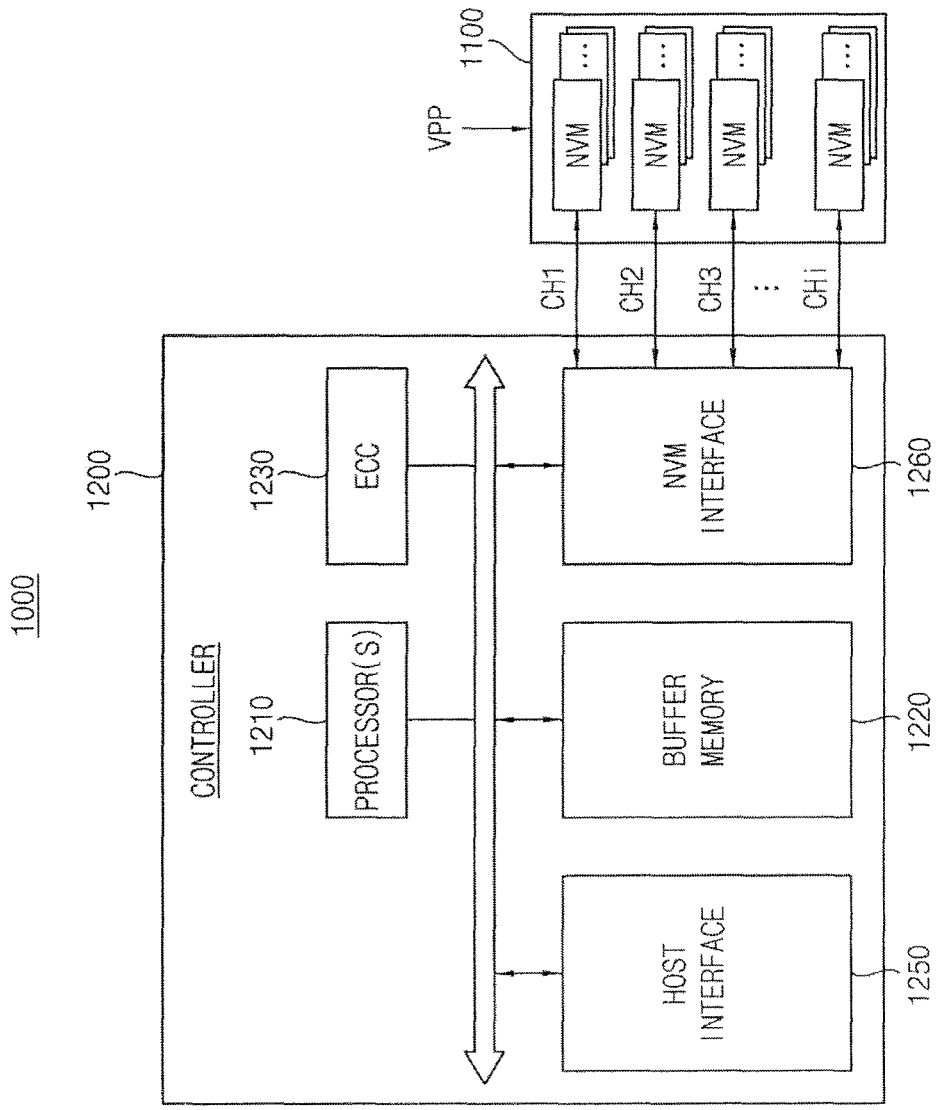
FIG. 17 illustrates a block diagram of a solid state disk or solid state drive (SSD) according to exemplary embodiments.

FIG. 17 illustrates a block diagram of a solid state disk or solid state drive (SSD) according to exemplary embodiments.

Referring to FIG. 17, an SSD 1000 may include multiple vertical memory devices 1100 and an SSD controller 1200.

In an implementation, the vertical memory devices 1100 may be optionally supplied with an external high voltage (or a second power supply voltage) VPP. Each of the vertical memory devices 1100 may include the vertical memory device 5 of FIG. 2.

Therefore, each of the vertical memory devices 1100 may include a plurality of cell regions, each cell region including a plurality of vertical channels spaced apart in a first direction and regularly arranged, a plurality of bit-lines extending a second direction crossing the first direction and spaced apart in the first direction, and a plurality of bit-line contacts that electrically connect the vertical channels to the bit-lines. The loads of the bit-lines may be equalized by connecting each of the bit-lines to at least two vertical channels having different types through the bit-line contacts.

The SSD controller 1200 may be connected to the vertical memory devices 1100 through multiple channels CH1 to CHi. The SSD controller 1200 may include, e.g., one or more processors 1210, a buffer memory 1220, an ECC block 1230, a host interface 1250, and a nonvolatile memory interface 1260.

The buffer memory 1220 may store data used to drive the SSD controller 1200. The buffer memory 1220 may include multiple memory lines each storing data or a command. The ECC block 1230 may calculate error correction code values of data to be programmed at a writing operation and may correct an error of read data using an error correction code value at a read operation. In a data recovery operation, the ECC block 1230 may correct an error of data recovered from the nonvolatile memory devices 1100.

In some embodiments, the vertical memory device and/or the memory system may be packaged in various forms.

The exemplary embodiments may be employed by various electronic devices which include vertical memory devices.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, in vertical memory devices in which channel holes having a multi-hole structure are formed, the characteristics of memory cells formed in the channel holes may vary according to a distance between each channel hole and an isolation region adjacent thereto.

The embodiments may provide a vertical memory device capable of equalizing electrical characteristic of bit-lines connected to vertical channels.

The embodiments may provide a method of manufacturing a vertical memory device capable of equalizing electrical characteristic of bit-lines connected to vertical channels.

When connecting vertical channels having different types according to a distance from a sub isolation region to bit-lines through bit-line contacts, loading of the bit-lines may be equalized by connecting each of the bit-lines to at least two vertical channels having different types in each of a first cell region and a second cell region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A vertical memory device, comprising:
a cell array including a plurality of cell regions spaced apart from each other in a second direction, each cell region of the plurality of cell regions including a regularly arranged plurality of vertical channels;
a plurality of bit-lines extending in the second direction, the bit-lines being spaced apart from each other in a first direction crossing the second direction; and
a plurality of bit-line contacts respectively electrically connecting the plurality of vertical channels and the plurality of bit-lines,
wherein each cell region of the plurality of cell regions includes a sub isolation region configured to electrically isolate the cell region in the second direction, the sub isolation region extending in the first direction,
wherein the plurality of vertical channels are classified into a plurality of types according to a distance from the sub isolation region in the second direction in each of the cell regions, and
wherein the plurality of bit-line contacts are configured to electrically connect each bit-line of the plurality bit-lines to at least two vertical channels having different types.

2. The vertical memory device as claimed in claim 1, wherein:
the vertical channels are disposed to form a zigzag arrangement along the first direction, and
the zigzag arrangement is repeated in the second direction.

3. The vertical memory device as claimed in claim 2, wherein:
each cell region of the plurality of cell regions further includes at least one dummy channel, and
the plurality of vertical channels and the at least one dummy channel are disposed to form the zigzag arrangement.

4. The vertical memory device as claimed in claim 3, wherein the at least one dummy channel is provided in the sub isolation region of each cell region of the plurality of cell regions.

5. The vertical memory device as claimed in claim 3, wherein the at least one dummy channel has a same configuration as a configuration of each vertical channel of the plurality vertical channels.

6. The vertical memory device as claimed in claim 1, wherein:
the cell array further includes at least one isolation region, the at least one isolation region extending in the first direction and being configured to electrically isolate each cell region of the plurality of cell regions in the second direction, the plurality of cell regions includes:
- a first cell region isolated by a first isolation region and a second isolation region; and
- a second cell region isolated by the second isolation region and a third isolation region, the first cell region includes a first sub isolation region configured to isolate the first cell region in the second direction, and the second cell region includes a second sub isolation region configured to isolate the second cell region in the second direction.

7. The vertical memory device as claimed in claim 6, wherein:
- first vertical channels of the plurality of vertical channels are provided on the first cell region and arranged to have an axial symmetry with respect to the first sub isolation region;
- second vertical channels of the plurality of vertical channels are provided on the second cell region and arranged to have an axial symmetry with respect to the second sub isolation region;
- the first vertical channels and the second vertical channels are arranged to have an axial symmetry with respect to the second isolation region, and
- at least one first dummy channel is provided on the first cell region and at least one second dummy channel is provided on the second cell region and are arranged to have an axial symmetry with respect to the second isolation region.

8. The vertical memory device as claimed in claim 7, wherein:
- the at least one first dummy channel is provided on the first sub isolation region;
- the at least one second dummy channel is provided on the second sub isolation region;
- first bit-line contacts of the plurality of bit-line contacts are provided on the first cell region and on an imaginary line parallel to the second direction, and are arranged to have a point symmetry with respect to the first sub isolation region;
- second bit-line contacts of the plurality of bit-line contacts are provided on the second cell region and on the imaginary line, and are arranged to have a point symmetry with respect to the second sub isolation region; and
- the first bit-line contacts and the second bit-line contacts are arranged to have a point symmetry with respect to the second isolation region.

9. The vertical memory device as claimed in claim 8, wherein:
- the first cell region further includes a first dummy contact formed on the at least one first dummy channel; and
- the second cell region further includes a second dummy contact formed on the at least one second dummy channel.

10. The vertical memory device as claimed in claim 7, wherein:
- the at least one first dummy channel is provided on the first sub isolation region;
- the at least one second dummy channel is provided on the second sub isolation region;
- first bit-line contacts of the plurality of bit-line contacts are provided on the first cell region and on an imaginary line parallel to the second direction, and are arranged to have a point symmetry with respect to the first sub isolation region;
- second bit-line contacts of the plurality of bit-line contacts are provided on the second cell region and are arranged to have an axial symmetry with respect to the second sub isolation region; and
- the first bit-line contacts and the second bit-line contacts on the imaginary line are arranged to have a point symmetry with respect to the second isolation region.

11. The vertical memory device as claimed in claim 10, wherein:
- the first cell region further includes a first dummy contact formed on the at least one first dummy channel; and
- the second cell region further includes a second dummy contact formed on the at least one second dummy channel.

12. The vertical memory device as claimed in claim 6, wherein:
- first vertical channels of the plurality of vertical channels are provided on the first cell region and are arranged to have an axial symmetry with respect to the first sub isolation region;
- second vertical channels of the plurality of vertical channels are provided on the second cell region and are arranged to have an axial symmetry with respect to the second sub isolation region;
- the first vertical channels and the second vertical channels are on imaginary line parallel to the second direction and are arranged to have an axial symmetry with respect to the second isolation region, and
- at least one first dummy channel is provided on the first cell region and at least a second dummy channel is provided on the second cell region and are arranged to have a point symmetry with respect to the second isolation region and the imaginary line.

13. The vertical memory device as claimed in claim 12, wherein:
- the at least one first dummy channel is provided on the first sub isolation region;
- the at least one second dummy channel is provided on the second sub isolation region;
- first bit-line contacts of the plurality of bit-line contacts are provided on the first cell region and on the imaginary line, and are arranged to have a point symmetry with respect to the first sub isolation region;
- second bit-line contacts of the plurality of bit-line contacts are provided on the second cell region and on the imaginary line, and are arranged to have a point symmetry with respect to the second sub isolation region; and
- the first bit-line contacts and the second bit-line contacts are arranged to have a point symmetry with respect to the second isolation region.

14. The vertical memory device as claimed in claim 13, wherein:
- the first cell region further includes a first dummy contact formed on the at least one first dummy channel; and
- the second cell region further includes a second dummy contact formed on the at least one second dummy channel.

15. A vertical memory device, comprising:
- a cell array including a plurality of cell regions spaced apart from each other in a second direction, each cell region of the plurality of cell regions including a regularly arranged plurality of vertical channels and at least one dummy channel;

a plurality of bit-lines crossing the cell array in the second direction, the bit-lines being spaced apart from each other in a first direction crossing the second direction; and a plurality of bit-line contacts configured to respectively electrically connect the plurality of vertical channels to the plurality of bit-lines, wherein the plurality of vertical channels are classified into a plurality of types according to a distance in the second direction from at least one sub isolation region that isolates each of the cell regions in the second direction, and wherein the plurality of bit-line contacts are configured to electrically connect each bit-line of the plurality bit-lines to at least two vertical channels having different types in each of the cell regions.

16. The vertical memory device as claimed in claim 15, wherein the cell array further includes a plurality of isolation regions configured to isolate the cell regions from each other and extending in the first direction.

17. The vertical memory device as claimed in claim 15, wherein:

wherein vertical channels of the plurality of vertical channels provided in each of the cell regions are disposed to form a zigzag arrangement along the first direction, and the zigzag arrangement is repeated in the second direction, and the plurality of vertical channels and the at least one dummy channel are disposed to form the zigzag arrangement.

18. A method of manufacturing a vertical memory device including a cell array including a plurality of cell regions spaced apart from each other in a first direction, each cell region of the plurality of cell regions including a regularly arranged plurality of vertical channels; a plurality of bit-lines extending in a second direction crossing the first direction, the plurality of bit-lines being spaced apart from each other in the first direction; and a plurality of bit-line contacts configured to respectively electrically connect the plurality of vertical channels and the plurality of bit-lines, the method comprising:

designing a layout of the vertical memory device;

verifying whether loads of the plurality of bit-lines are equalized in the layout;

upon verifying that the loads of the bit-lines are equalized, manufacturing a mask for the vertical memory device; and manufacturing the vertical memory device using the mask, wherein the plurality of vertical channels are classified into a plurality of types according to a distance in the second direction from at least one sub isolation region that isolates each of the cell regions in the second direction, and wherein the plurality of bit-line contacts are configured to electrically connect each bit-line of the plurality bit-lines to at least two vertical channels having different types in each of the cell regions.

19. The method as claimed in claim 18, wherein verifying whether loads of the plurality of bit-lines are equalized in the layout includes:

classifying the plurality of vertical channels into the plurality of types;

arranging the plurality of bit-line contacts such that each bit-line of the plurality of bit-lines are connected to at least two vertical channels having different types; and respectively connecting the plurality of vertical channels to the plurality of bit-lines with the arrangement to verify whether loads of the plurality of bit-lines are equalized.

20. The method as claimed in claim 18, wherein the sub isolation region includes a selection line cut region.

* * * * *